US007170771B2

(12) United States Patent
Hannah et al.

(10) Patent No.: US 7,170,771 B2
(45) Date of Patent: Jan. 30, 2007

(54) METHOD OF READING A DATA BIT INCLUDING DETECTING CONDUCTIVITY OF A VOLUME OF ALLOY EXPOSED TO AN ELECTRON BEAM

(75) Inventors: Eric C. Hannah, Pebble Beach, CA (US); Michael A. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/942,286

(22) Filed: Sep. 15, 2004

(65) Prior Publication Data

US 2005/0041567 A1   Feb. 24, 2005

Related U.S. Application Data

(62) Division of application No. 10/331,700, filed on Dec. 28, 2002, now Pat. No. 6,969,868.

(51) Int. Cl.
*G11C 13/00* (2006.01)
*H01L 29/06* (2006.01)

(52) U.S. Cl. .................. 365/118; 365/118; 365/128; 257/10; 257/14

(58) Field of Classification Search ............ 257/10, 257/15, 16
See application file for complete search history.

(56) References Cited

U.S. PATENT DOCUMENTS

| 5,557,596 | A | * | 9/1996 | Gibson et al. ............. 369/101 |
| 6,087,674 | A | * | 7/2000 | Ovshinsky et al. ........... 257/2 |
| 6,243,348 | B1 | * | 6/2001 | Goodberlet ................ 369/101 |
| 2003/0206512 | A1 | * | 11/2003 | Ashton ..................... 369/101 |

* cited by examiner

*Primary Examiner*—Andy Huynh
*Assistant Examiner*—Thinh T Nguyen
(74) *Attorney, Agent, or Firm*—George Chen

(57) ABSTRACT

Alloy memory structures and methods are disclosed wherein a layer or volume of alloy material changes conductivity subsequent to introduction of a electron beam current-induced change in phase of the alloy, the conductivity change being detected using current detection means such as photon-emitting P-N junctions, and being associated with a change in data bit memory state.

6 Claims, 4 Drawing Sheets

METHOD OF READING A DATA BIT INCLUDING DETECTING CONDUCTIVITY OF A VOLUME OF ALLOY EXPOSED TO AN ELECTRON BEAM

This is a Divisional application of Ser. No. 10/331,700 filed Dec. 28, 2002, now U.S. Pat. No. 6,696,868 issued on Nov. 29, 2005.

BACKGROUND OF THE INVENTION

The predominant mass storage device in conventional computing devices is the hard disk drive. Hard disk drives are relatively large, electromechanical devices that can store a relatively large amount of data. The stored data is accessed through a read/write head that rides on a cushion of air above the rapidly rotating disk. The read/write head moves radially to access data in different tracks of the rotating disk. Data transfer is limited by the speed at which the disc rotates and the speed with which the read/write head is positioned over the required track. Even with the fastest devices, access times are on the order of thousands of microseconds, due to the relatively large mechanical motions and inertia involved. This time scale is at least seven orders of magnitude slower than the sub-nanosecond time scales at which processors operate. The discrepancy may leave the processor starved for data. Compact Disc and DVD storage systems, also limited by the speed at which a disc rotates and the speed with which a read/write head is positioned over a required track, are associated with similar discrepancies.

During the time the processor is starved for data, either valuable computing time is lost or the processor must perform another task, which also may lead to data starvation. Such data starved conditions are referred to in the art as being input/output (I/O) bound or bottlenecked.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those skilled in the art to practice the invention. The following detailed description is, therefore, not to be taken in a limiting sense, and the scope of the invention is defined only by the appended claims.

Devices and methods are disclosed to store data using a memory without moving parts. In one embodiment of the present invention, an electron beam (e-beam) is used to irradiate a volume or layer of an alloy material which corresponds to an encoded data bit location. Exposure of the alloy material to a modulated high-energy e-beam changes the conductivity of the alloy material, creating at least two different states of conductivity, which may be associated with the binary data bit memory states of, e.g., "0" and "1", or any multilevel value between the two terminal states. Reading the stored data is accomplished with a lower energy e-beam that does not alter the state of conductivity created by the high-energy e-beam during data writing. The lower energy e-beam may be used according to various embodiments of the invention to read the conductivity of the alloy material, which corresponds to the data stored therein. The invention is not limited to storing and reading binary data. The invention is applicable to n-ary data, however to simplify the description, the example of binary data will be followed. Mass-related issues with moving parts, such as inertia, have previously limited the data seek time in conventional devices, which is associated with rotational latency and mechanical steering of a read/write head.

The association of the binary values for data bit memory states, e.g., "0" or "1", is completely arbitrary with respect to the state of conductivity within the alloy; the invention is not limited by the association made. An extension to n-ary data may be achieved by creating more than two distinct conductivity states within phase change material. For example, three distinct conductivity states could be associated with trinary data.

Figure 1:
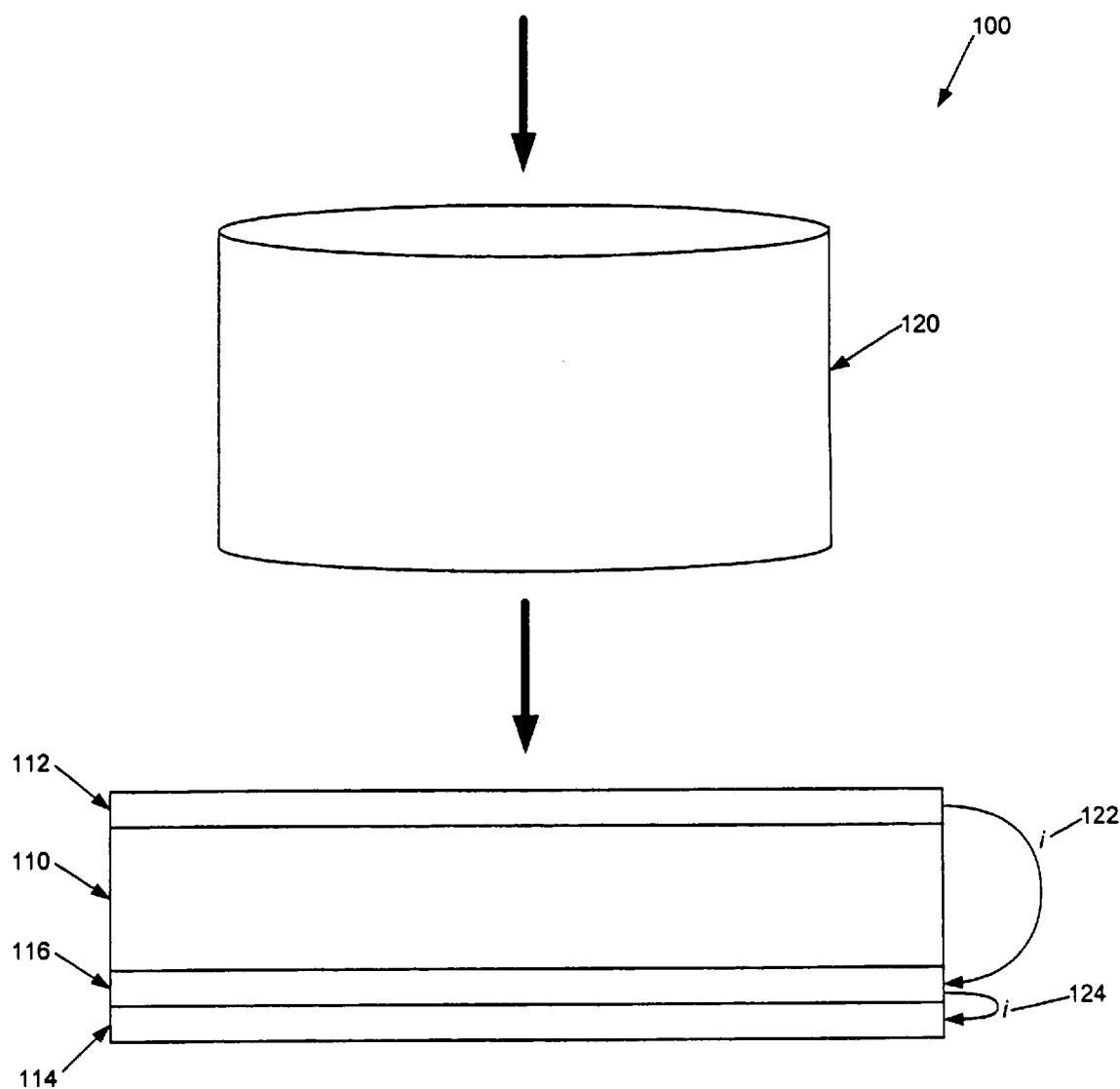
FIG. 1 illustrates an alloy memory element.

With reference to FIG. 1, device 100 includes a volume of alloy 110 coupled with a conductor 112 and a conductor 114. A variable-energy e-beam 120 operating at a high-energy level, incident upon the alloy 110, is used to deliver an electron current and thereby heat to the alloy 110. Use of the term "high-energy" is application-dependent and will depend upon several device design parameters. A non-exclusive list of device design parameters influencing the term 'high-energy" includes the alloy material, the degree of conductivity change desired, the e-beam exposure time (corresponding to the time allotted to change the conductivity of the alloy), and the volume of the data cell within the alloy. A typical range of "high-energy" is 400–10,000 electron volts (eV) with an electron-beam current in the range of 10–3,000 nano-amps.

The alloy 110, shown in FIG. 1, may correspond to a data cell within an array of data cells. The term "alloy" generally refers to a mixture of at least two metals. Similar binary or n-ary resistance behaviors may be created in organic or organo-metallic materials and these materials may be applied in the same way at different power levels and cycle times for data storage. It is well known that through thermal treatment, the microstructures of certain alloys may be manipulated to produce stable physical states with physical, chemical, and electrical properties that vary from other stable physical states of the same alloy that have been through different thermal treatment. Particularly relevant to this invention are the significant difference in electrical conductivity which exists between alloy states, and the thermal treatment requirements to change an alloy from one state to another. Chalcogenide alloys, preferred in this invention, are known to have stable crystalline and amorphous states with significantly different electrical conductivities and adequate phase-reversal cycling capabilities.

A volume of chalcogenide alloy may be heated above its melting temperature and then cooled past its recrystallization temperature either to a primarily amorphous state ("amorphous state" or "amorphous phase"), or to a state having more crystallinity ("crystalline state" or "crystalline phase"), depending upon the cooling time during which the alloy remains above the recrystallization temperature (the "cooling profile" of temperature versus time). To keep the material from recrystallizing during cooling and resulting in a crystalline phase structure, the cooling rate must be faster than the crystal nucleation and growth rate for the particular material. Relatively fast cooling profiles, therefore, are more likely to result in amorphous state structures, and relatively slow cooling profiles are more likely to result in crystalline state structures. Controlling the cooling profile, therefore, is a key variable for determining which logic state is written. As with other alloys, the electrical conductivity of crystalline phase chalcogenide alloy is significantly higher than that of amorphous phase chalcogenide alloy due to the differences in physical order of the alloy material at the microstructural level and the fact that electrons travel more efficiently through ordered, or crystalline, microstructures. In terms of data bit memory state logic, the melting may be used to "reset" a data bit, and the cooling profile selected to either result in a crystalline phase solid (either a "0" or a "1" in a binary example) or an amorphous phase solid (the binary complement of the crystalline phase logical representation). While multiple chalcogenide alloys with two or more stored phases accessible via e-beam irradiation are known, those comprising Germanium, Antimony, and Tellurium are preferred, such as the alloy having the formula "$Ge_2Sb_2Te_5$", with a melting temperature of 616 degrees Celsius and a recrystallization temperature of 142 degrees Celsius. With this preferred alloy, an amorphous phase may be reached along a relatively fast cooling profile by cooling past the recystallization temperature within about two nanoseconds, while a crystalline phase may be reached by a relatively slow cooling to the recrystallization temperature in a minimum of about two nanoseconds. Also preferred are alloys such as those used in high-speed optical storage devices for "fast writing", such as those comprising combinations of Germanium, Antimony, and Tellurium, and combinations of Silver, Indium, Antimony, and Tellurium, wherein a crystalline phase of relatively high conductivity may be reached as a result of heating the fast-write material to about 85% of the melting temperature for the composition, followed by relatively slow cooling to enable heated material to nucleate relatively large, contiguous crystals based upon adjacent crystallites of the same material positioned around the boundary of the heated region. Such fast-write alloys enable a faster change from amorphous phase to crystalline phase, since the material need not be taken to the melting temperature before crystal nucleation. To reach an amorphous phase of relatively low conductivity with a fast-write material, heating to about 110% of the melting temperature for the material is followed by cooling along a relatively fast cooling profile, wherein the cooling rate is faster than the crystal nucleation and growth rate for the particular material to avoid the formation of a highly-ordered crystalline structure. Therefore, as opposed to melting the alloy for a "reset" type operation, and cooling at various rates to proceed to either a crystalline phase, or an amorphous phase, as with conventional chalcogenide alloys, fast-write alloys need not be melted unless an amorphous phase result is desired—since a crystalline phase may be reached by heating to about 85% of the melting temperature, followed by cooling along a relatively slow cooling profile. For example, a fast-write alloy associated with cooling profiles similar to those described above in reference to the preferred Germanium, Antimony, and Tellurium alloy, may be heated to about 85% of melting temperature and cooled to the recystallization temperature of the fast write alloy in a minimum of about two nanoseconds to provide a highly conductive crystalline structure, while the same fast write material may be heated to about 110% of melting temperature and cooled past its recrystallization temperature within about two nanoseconds to provide a less conductive amorphous structure.

E-beam irradiation is used both as a means for heating the alloy 110 to melting temperature, and also as a means for controlling the cooling profile of temperature versus time as the alloy is cooled subsequent to melting. In one embodiment, for example, a reset and subsequent amorphous stored phase is achieved by e-beam irradiation to melting followed by cooling without further e-beam irradiation, while a reset and subsequent crystalline stored phase is achieved by e-beam irradiation to melting followed by a decrease in e-beam irradiation along a slower cooling profile. In other words, a crystalline stored phase is reached via a cooling profile wherein cooling is slowed by continued irradiation at a decreased rate. In one embodiment, a decrease in irradiation to slow cooling is achieved using power tapering, wherein the voltage and/or current to the e-beam source is decreased. In another embodiment, intermittent exposure, or exposure tapering, is used to decrease irradiation during cooling. In another embodiment, a slower cooling profile is achieved by creating thermal mass in an adjacent structure during cooling. Such thermal mass may be achieved using e-beam exposure. Hybrids of the aforementioned cooling profile control techniques may also be utilized. For example, the cooling at a data cell location may be controllably slowed by irradiating structures immediately surrounding the location to create thermal mass around the location, while the location itself also may be irradiated to a degree sufficient to contribute to slow cooling of the location. Many variations of exposure patterns may be employed in such hybrid embodiments, including but not limited to spiral patterns, wherein a portion of the data cell location at the center of the spiral receives more focused irradiation than other portions, due to the focusing nature of a repeated spiral pattern and/or decreased radial spacing between spirals as they get closer to the portion of the data cell location at the center of the spiral; stepped concentric circles used in a similar fashion as described for spirals, with the exception that the e-beam is paused at each of a set of circular radii, the radii being equally spaced or concentrated toward the center of curvature; and rectilinear scanning or rastering combined with focused irradiation exposure to a targeted location. Similarly, hybrid exposure patterning could be used to emphasize exposure more upon the adjacent structures as opposed to the data cell location itself. Exposure patterning may be combined with power tapering and/or exposure tapering to provide further cooling profile control. Cooling profiles for chalcogenide alloys such as $Ge_2Sb_2Te_5$ are known in the art and used in devices such as CD-RW, which use laser light irradiation rather than e-beam irradiation to control cooling.

Referring back to FIG. 1, in a data write phase, electron e-beam 120 (at high-energy) creates a change in conductivity within the volume or layer of alloy 110. Reading the data is accomplished by introducing current into the alloy 110 via a low-energy e-beam, from either the write e-beam source modulated to a lower energy or from an alternate e-beam at a lower energy, than the energy level of the "high-energy" e-beam used for writing the data. This low-energy e-beam used for reading may be less than approximately 100 electron volts (eV), and shall be of a sufficiently small diameter so that it will not degrade the data bit memory state of the alloy at the data bit location or any adjacent data bit locations. In other words, the low-energy e-beam irradiation for reading data causes an excitation of the alloy 110 insufficient to heat the alloy 110 above its recrystallization temperature.

The low-energy e-beam introduces an electron current into a data bit location corresponding with device 100 in FIG. 1. The conductor 112 and reference conductor 114 provide a differential conducting path, which will conduct a majority of the current indicated by 122 (the "bleed off current") when the alloy 110 is highly conductive. Alternatively, when the alloy 110 is highly resistive an increase will occur in the number of the electrons that will propagate down through the alloy 110 and reference conductor 116 to the conductor 114. The conductor 114 and the reference conductor 116 provide a second differential conducting path for the current indicated by 124 (the "transmitted current"). Either one or both of the bleed-off and transmitted currents may be used to associate the state of conductivity within the alloy 10 with the memory state of data stored in a bit. The e-beam 120 depicted represents either the high-energy e-beam used to write the data or the low energy e-beam used to read the data.

Once the current has been steered, according to the state of the alloy 110, many embodiments of the present invention may be used to sense, i.e. read the current. In one embodiment of the present invention, a fixed impedance reference layer (typically with an impedance much greater than the low impedance memory state of the alloy storage layer) is attached to the alloy on the side opposite to the electron-beam. The electron-beam's current distribution is then measured differentially between the conductor 112 and the conductor 114 using a current detector (not shown). The current will distribute differently based upon the conductivity of the alloy storage layer.

In another embodiment, the reference layer is replaced by using a relatively thick layer of the alloy where only the portion of this layer closest to the electron-beam 120 is thermally modified to represent the memory state, while the remaining alloy material remains unchanged from the initial condition, thus acting as the reference layer cited in the previously-described embodiment.

Figure 2:
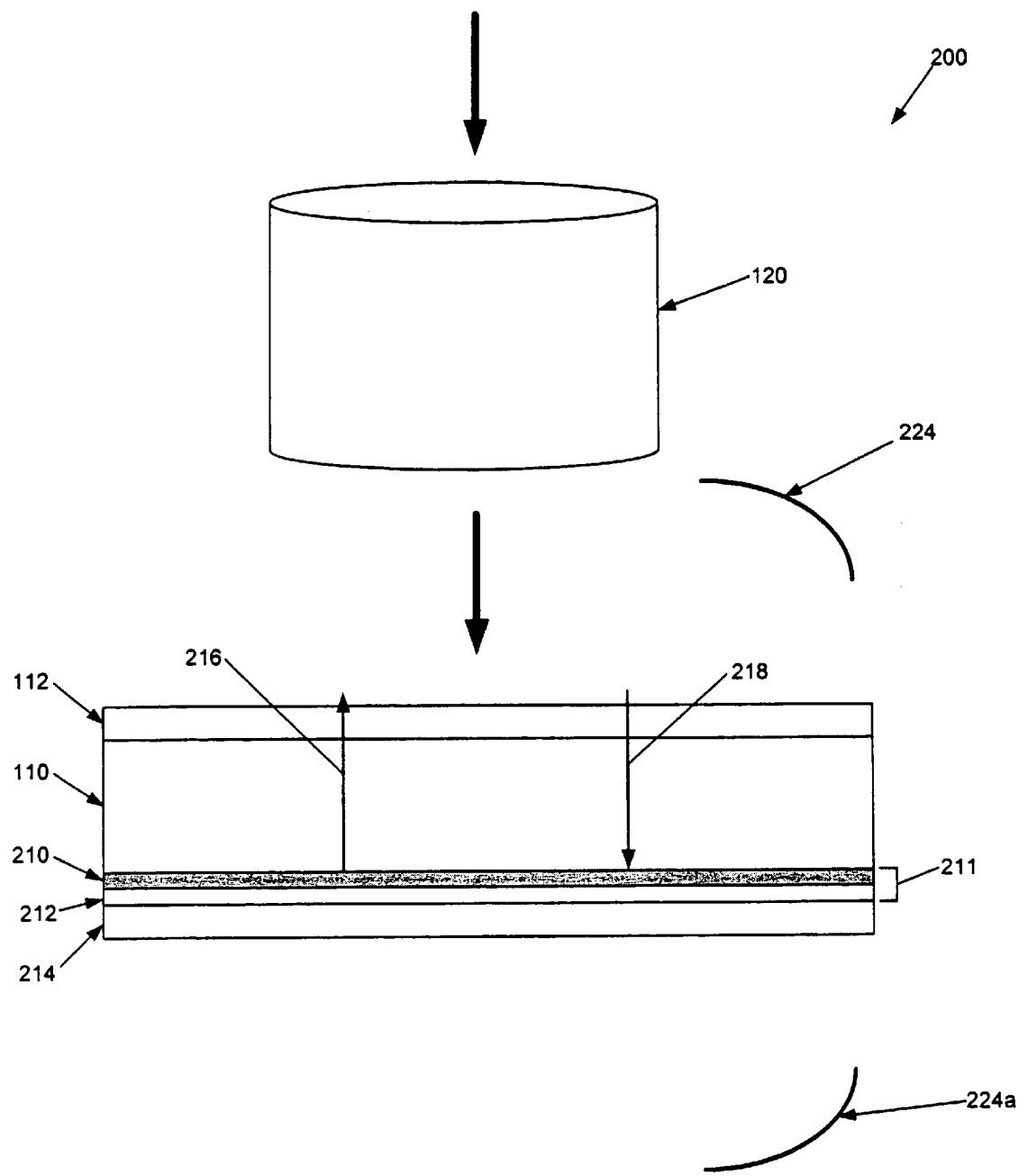
FIG. 2 illustrates an alloy/LED configuration.

In another embodiment of the present invention, the device 100 (FIG. 1) may be coupled with a light-emitting semiconductor P-N junction as shown in FIG. 2 to achieve a differential light emission device 200 corresponding to the state of conductivity within the alloy 110. FIG. 2 illustrates an alloy/LED configuration. With reference to FIG. 2, a P-N junction 211 is placed beneath phase change material 110. The P-N junction 211 may be created from a direct band semiconductor such as those commonly made from III–V elements, e.g., GaAs, or other electron excited light emitting structures. In one embodiment, doping is arranged so that the N-type 210 layer of the P-N junction 211 is coupled with the alloy 110 allows for easy transport of the filtered electrons into the P-N junction 211. A very thin, conductive interlayer may be used to backward bias the P-N junction from a high impedance source or to provide lattice matching between the P-N junction and the alloy 110. Below a P-type 212 layer of the P-N junction, a conductor 214 is placed which may be a normal metal pad. The conductor 214 supplies holes to the P-N junction. The material used for the conductor 214 may be selected to optimize the reflection of the light generated in the P-N junction. An advantage of using a direct-band semiconductor is that the recombination of electrons and holes may create photons without requiring phonon emission to conserve momentum. The thickness of the N-type 210 layer and the P-type 212 layer must be sufficient to support the full transition region and optimally couple to external electromagnetic modes.

In another embodiment of the present invention, differential light emission is achieved by the device 200 by varying the amplitude of the current passed by the varying conductivity of the alloy 110 between the cross-linked and damaged states. In one conductivity state 218, the alloy 110 will conduct an increase in the number of electrons through its thickness to the P-N junction resulting in a maximum emission of light. The maximum emission of light may correspond to one memory state for the data stored therein. The emitted light may be sensed by photo-detector 224. In another conductivity state 216, a minimum amount of current is conducted through the alloy 110, instead the majority of the current is "bled off" via conductor 112, as previously described resulting in a minimum emission of light from the P-N junction. The minimum emission of light may correspond to a second memory state for the data stored therein.

The alloy/P-N junction structure, shown at 200, need not be etched out from the surrounding material to allow photons to escape the P-N junction 211. The layer (conductor 112) above the P-N junction may be made very thin. Photons can penetrate more than a micron of metal conductor thickness and much further through other materials. Therefore, the conductor 112 may be on the order of a micron or less in thickness, thereby providing a sufficient electrically conductive path while allowing photons to pass through the conductor 112. The device 200 acts as a tiny dot illuminator when irradiated with the read e-beam, causing the P-N junction to emit light in one conductivity (memory) state while the P-N junction remains dark in another conductivity (memory) state.

Figure 3:
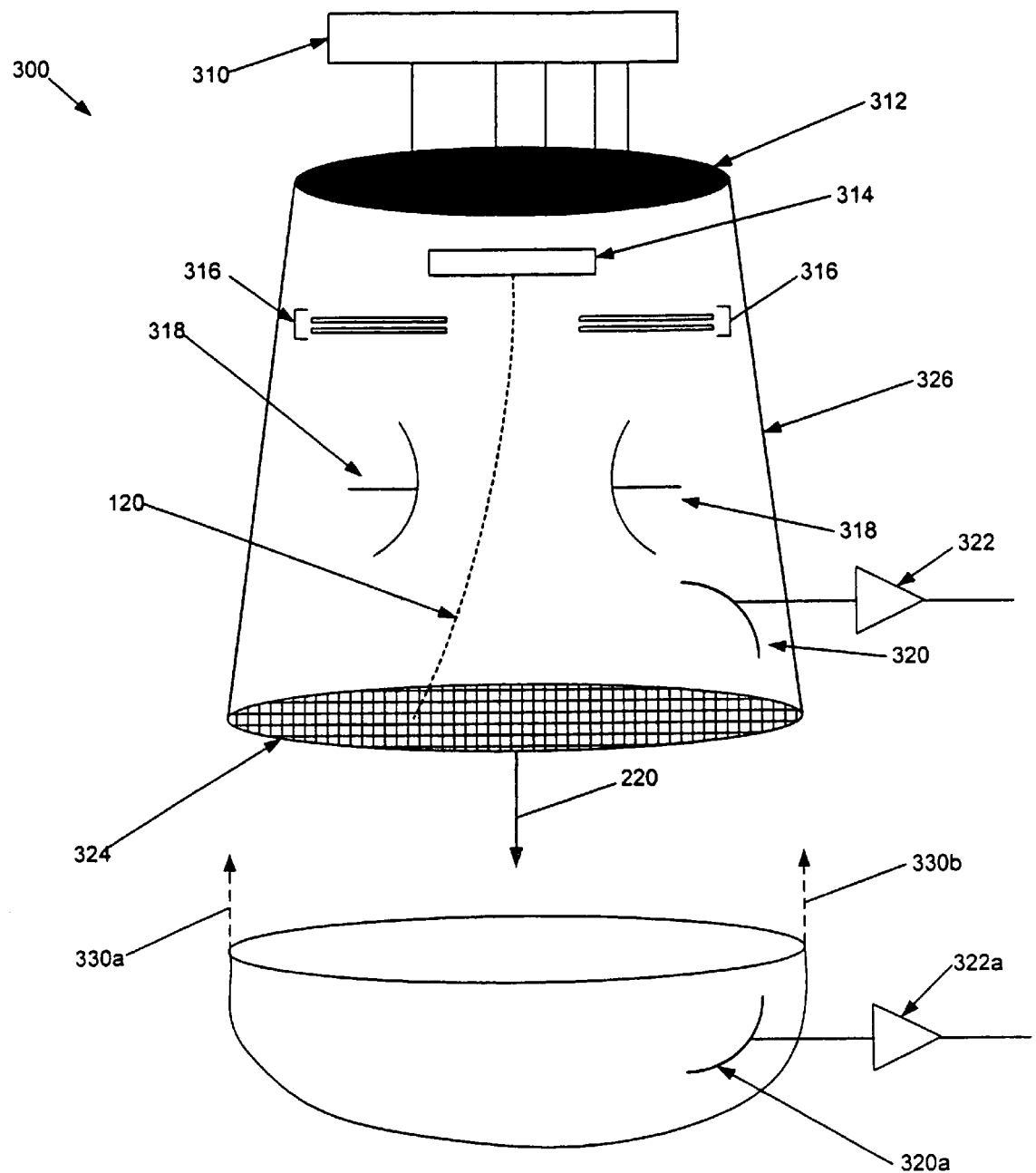
FIG. 3 illustrates an alloy/LED memory device.

An embodiment of the present invention is shown in FIG. 3 illustrating an alloy/P-N junction memory device. With reference to FIG. 3, one or more alloy data elements are indicated at an alloy/LED 324 array. A vacuum shroud or enclosure 326 and an end cap 312 form a closed container (a high vacuum environment) in which electron beam source 314 emits e-beam 120, incident upon the alloy/LED 324 planar array. Control electronics 310 may be used in conjunction with the electron beam source 314 as needed to control the e-beam source. The e-beam 120 may be steered by means of electron lens 316 and deflection electrodes 318.

The e-beam 120 may be used to write data to the alloy/LED 324 planar array, as previously described, as well as to read data written therein. Accordingly, the level of light generated by the alloy/P-N junction of the data bit is measured by a sensitive photo-detector 320, by methods well known in the art. The vacuum shroud 326 may be made reflective on the inside, thereby acting as an integrating sphere for the emitted photons, which increases the signal-to-noise ratio for the measurement made by the photo-detector 320. The output of the photo-detector 320 may be amplified as required by photo amp 322. The e-beam 120 is steered across the phase change material/LED 324 array to read data stored in the data bit locations corresponding to dots on the surface of alloy/LED 324. Thus, writing and reading data is accomplished without the mechanically articulated parts required by the hard disk drive, CD-ROM and the DVD. Using the teachings of the present invention, the seek time to reach any block of data is on the order is tens of microseconds.

A read-after-write capability is provided during data bit writing by the conductivity state switching within the alloy 110. During data writing with the high-energy e-beam, the impedance of the alloy 110 will change—due to the induced state change, resulting in a sudden pulse of light as electron current is passed or removed from the P-N junction. Sensing the pulse of light during the thermal decrease cycle will provide a read-after-write capability similar to that provided by the second head in a tape drive or similar polarization shift effect in a magneto-optic disc drive.

In an alternative embodiment, the substrate (conductor 214 in FIG. 2) may be made sufficiently thin or transparent to allow photons to be emitted from the opposite side that e-beam 120 is incident upon phase change material 110. This opposite side is indicated as 220 in FIG. 2 and FIG. 3. The emitted light may be sensed from the lower side of the structure as shown in FIG. 2 at photo-detector 224a and in FIG. 3 at photo-detector 320a. The photo-detector 320a may be configured with photo-amp 322a. This arrangement has the feature of removing the electron optics from the photo-detector's field of view. One way to provide a high vacuum environment to the lower side of vacuum shroud 326 is to couple fixture 326a with vacuum shroud 326 by mating as indicated at 330a and 330b.

The e-beam 120 may be on the order of 20 nanometers in diameter. It is possible to steer the e-beam 120 through an angle of approximately 20 degrees, as will be explained in conjunction with FIG. 4. Very small e-beam sources may be manufactured, made using silicon processes. An example of such a device is the electron micro-column made by the Sensors Actuators and Microsystems Laboratory (SAMLAB), which is part of the Institute of Microtechnology, University of Neuchâtel, located in Switzerland. These very small e-beam sources (micro-column e-beam sources) may be produced in a form factor measuring approximately three millimeters wide and approximately one millimeter high. In one embodiment, using these parameters, a data storage device may be built to store approximately a terabyte of data on a polymer/LED area of several square centimeters.

Figure 4:
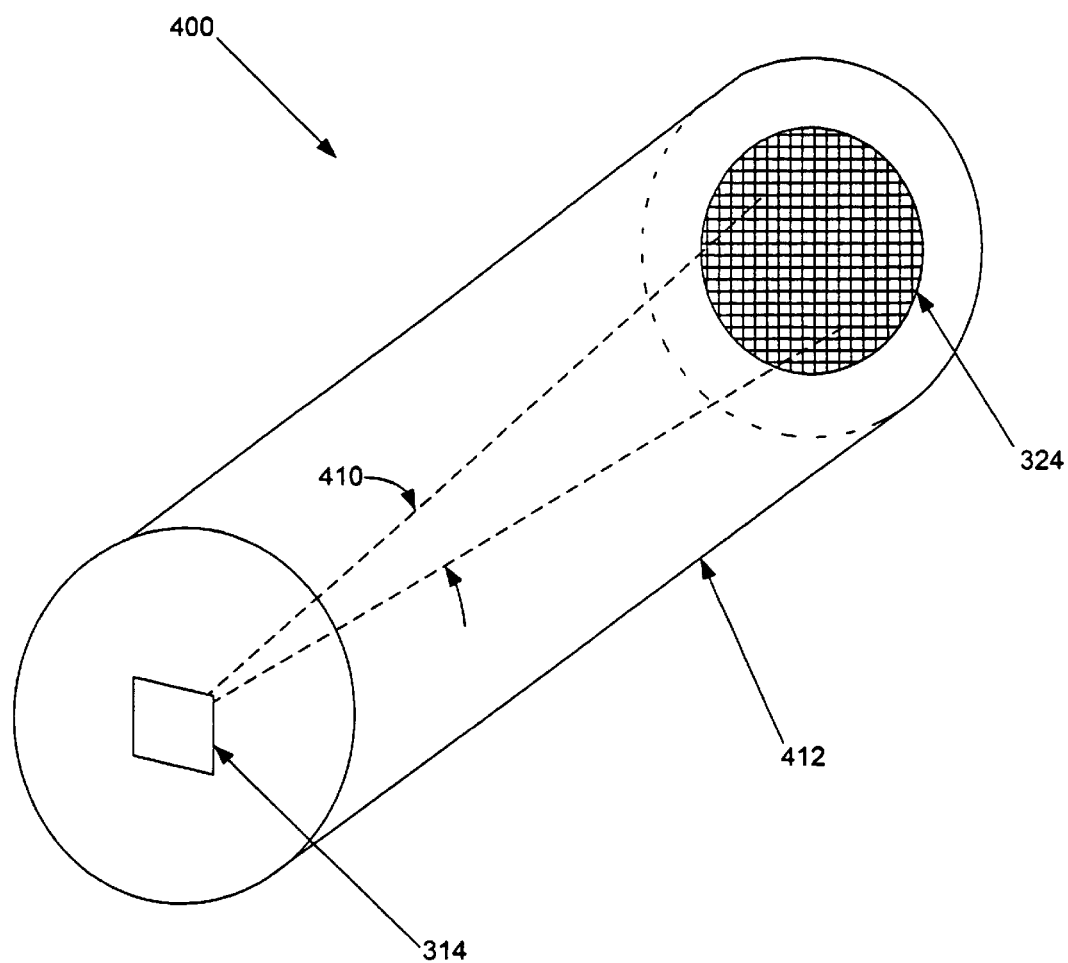
FIG. 4 illustrates an alternative embodiment of an alloy/LED memory device.

The present invention may be incorporated into various memory devices. FIG. 4 shows an alternative embodiment of a memory device 400. With reference to FIG. 4, a cylindrical container 412 is shown having a phase change material/LED layer 324 and an electron beam source 314. The e-beam source 314 may be steered through an angle 410 as shown. Thus, data may be written to an array having approximately 200 gigabytes of data in a device occupying a volume of approximately several cubic inches. These data storage devices may be configured in an array to achieve terabyte data storage capacities.

It is expected that many other shapes and configurations of data storage devices are possible within the teachings of the present invention. For example, a cube may be configured (not shown) with phase change material arrays lining the interior surfaces thereof. One or more electron beam sources may be configured within the cube, each facing an interior surface of the cube and being capable of writing and reading data stored in each phase change material array.

Thus, a novel solution to electron beam recording and sensing of data bits is disclosed. Although the invention is described herein with reference to specific preferred embodiments, many modifications therein will readily occur to those of ordinary skill in the art. Accordingly, all such variations and modifications are included within the intended scope of the invention as defined by the following claims.

The invention claimed is:

1. A method of reading a data bit comprising:
 modulating an electron beam to a lower energy;
 introducing a current from the electron beam into a volume of alloy at a location of the data bit;
 steering the current to a conductor and a reference conductor, the reference conductor being attached to the alloy on a side opposite to the electron beam;
 sensing differential current distribution between the conductor and the reference conductor
 detecting a state of conductivity within the volume of alloy; and
 associating the state of conductivity with a memory state stored in the data bit.

2. The method of claim 1 wherein exposing a volume of alloy to an electron beam causes an excitation of the volume of alloy insufficient to heat the volume of alloy above its recrystallization temperature.

3. The method of claim 1, wherein detecting a state of conductivity within the volume of alloy comprises using a differential conducting path to detect quantities of current moving through and around the volume of alloy.

4. The method of claim 1,
 wherein current transmitted through the volume of alloy interfaces with a P-N junction layer to emit photons in response to current transmitted though the volume of alloy; and
 wherein detecting a state of conductivity within the volume of alloy comprises monitoring photons emitted from the P-N junction layer.

5. The method of claim 1 wherein the volume of alloy comprises a chalcogenide alloy.

6. The method of claim 5 wherein the chalcogenide alloy comprises an element from the group including Germanium, Antimony, and Tellurium.

* * * * *